United States Patent [19]
Paley et al.

[11] Patent Number: 5,814,159
[45] Date of Patent: Sep. 29, 1998

[54] CLEANING METHOD

[75] Inventors: William R. Paley, Wayne; Steven J. Paley, Paramus; Douglas W. Cooper, Ramsey; Peter B. Russo, Califon; Jeffrey C. Sayre, Oakland; Howard D. Siegerman, Hillsdale; Robert N. Amabile, Hiawatha, all of N.J.

[73] Assignee: The Texwipe Company LLC, Upper Saddle River, N.J.

[21] Appl. No.: 803,781

[22] Filed: Feb. 24, 1997

Related U.S. Application Data

[63] Continuation of Ser. No. 527,153, Sep. 12, 1995, abandoned, which is a continuation-in-part of Ser. No. 402,113, Mar. 10, 1995, abandoned.

[51] Int. Cl.$^6$ .............................. B08B 7/00; B65D 79/00
[52] U.S. Cl. ..................... 134/6; 134/7; 134/42; 206/527
[58] Field of Search ...................... 134/6, 7, 42; 206/527

[56] References Cited

U.S. PATENT DOCUMENTS

| | | | |
|---|---|---|---|
| 2,925,719 | 2/1960 | Robbins, et al. | 62/4 |
| 2,933,431 | 4/1960 | Sperouleas | 167/84 |
| 3,038,473 | 6/1962 | Ladd | 128/268 |
| 3,608,709 | 9/1971 | Pike | 206/47 A |
| 3,889,804 | 6/1975 | Ravich | 206/223 |
| 4,312,473 | 1/1982 | Hoeller | 229/56 |
| 4,888,229 | 12/1989 | Paley et al. | 428/192 |
| 5,035,348 | 7/1991 | Seifert | 222/107 |
| 5,100,028 | 3/1992 | Seifert | 222/107 |

OTHER PUBLICATIONS

The Texwipe Company and others, "The Crush–tube Swab". Article: *"Presaturated Wipers Offer Several Advantages for Cleanroom"*, McBride and O'Connor, *Clean Rooms* magazine p. 14, et a. seq. Oct. 1994.

*Primary Examiner*—Zeinab El-Arini
*Attorney, Agent, or Firm*—Whitman Breed Abbott & Morgan LLP; Gregor N. Neff

[57] ABSTRACT

A cleaning kit for use in cleaning surfaces in clean rooms, semiconductor fabrication plants, pharmaceutical manufacturing facilities, etc. A stack of extremely clean wipers is packaged together with a container of cleaning fluid in a liquid-tight outer container. The outer container is vacuum-sealed. The kit is stored until just before it is to be used. Fluid is released from the inner container into the wipers, preferably by means of a puncturing device operable to puncture one of the walls of the inner container by the application of pressure in a limited area on the outside of the outer container. The cleaning liquid is allowed to soak into the wipers, and the wipers are removed from the outer container for use. The container can be resealed to protect the wipers after the package has been opened. The puncturing device is located away from the edges of the package to minimize the chances of accidental puncture. This device and method minimize deterioration of the wiper material due to prolonged contact with the cleaning fluid, and minimize the loss of effectiveness of substances such as biocides which might deteriorate due to prolonged contact with the wiper material.

13 Claims, 6 Drawing Sheets

CLEANING METHOD

This patent application is a continuation of application Ser. No. 08/527,153, filed Sep. 12, 1995, now abandoned, which is a continuation-in-part of U.S. patent application Ser. No. 08/402,113 filed Mar. 10, 1995and now abandoned.

This invention relates to cleaning devices and methods, and particularly to such devices and methods used in cleaning "clean rooms", semiconductor fabrication plants, semiconductor fabrication plants, pharmaceutical manufacturing facilities, and other cleaning applications and environments where extreme cleanliness must be maintained.

The requirements for maintaining cleanliness in semiconductor fabrication clean rooms, pharmaceutical manufacturing facilities and similar facilities are stringent.

In semiconductor fabrication clean rooms, surfaces frequently must be wiped with an exceptionally clean wiper and cleaning solution in order to prevent contamination. The contamination which is to be controlled often is called "microcontamination" because it consists of small physical contaminants, such as particulate matter of a size between that of bacteria and viruses, and chemical contaminants in very low concentrations, typically measured in parts per million or parts per billion.

The contaminants usually are of three types; particles, ions and "extractables", which are impurities leached from the fibers of the wiper.

Loose particles 100 micrometers and smaller in size are an anathema to obtaining high production yields and reliable semiconductor devices. Therefore, wipers and cleaning materials used in such clean rooms should emit as small a number of loose particles as possible.

Similarly, ions and "extractables" interfere with the exacting process of semiconductor manufacturing, and their quantities are to be minimized.

In the past, such requirements have been met by the provision of specially fabricated cloths designed to emit very few loose particles, while maintaining structural integrity when wetted with cleaning solution and being used to wipe the surfaces to be cleaned.

Typically, such wipers have been packaged in sealed containers such as flexible plastic bags, which can be opened, a wiper withdrawn, and the bag resealed. Then, the cleaning solution, kept in a separate container, is applied to the wiper, and the wiper is used.

A problem with the foregoing is that substantial quantities of sometimes dangerous chemical solvents used as cleaning fluids must be stored and applied to the wipers. This can result in accidents or working conditions deleterious to the health of the workers.

Another problem lies in the fact that when workers apply cleaning fluids from separate containers to dry wiper cloths, the amount of cleaning fluid used often is either too little or too much, which can result in ineffective cleaning, or oversaturation and waste.

In response to the latter problems, pre-saturated wipers have been developed and sold successfully. The wipers are pre-loaded with varying amounts of cleaning solutions, and packaged in a re-sealable plastic bag until needed. Then, the bag is opened, the wiper or wipers withdrawn, and the bag is re-closed. This is repeated until the bag is empty.

In accordance with the present invention, the inventors have recognized that bags of presaturated wipers often may be stored for prolonged periods, such as months or even years before use. During that time, the cleaning liquid and the wiper material are in intimate contact with one another. It is believed that this often leads to a degradation of the fibers of the wiper material such that the quantity of contaminants released by the wiper when used is substantially higher than when the wipers are first packaged. It is believed that the bonds holding the particles to the fibers are loosened, and the releasable ions and extractables are increased by prolonged contact between the cleaning solutions and the wipers.

In addition, where adhesives are used to fasten various parts of plastic packaging together, such as in the re-closable seal of some wiper packages, the adhesive may deteriorate due to prolonged contact with the cleaning liquid. The inventors have recognized that this limits the choice of adhesives that can be used.

In the cleaning of pharmaceutical manufacturing and other medical facilities, one of the problems lies in maintaining the effectiveness of a biocide contained in presaturated wipers. The applicants have recognized that the effectiveness of the biocide may deteriorate due to prolonged contact with the wiper material.

It is an object of the present invention to solve or alleviate the foregoing problems. In particular, it is desired to provide extremely clean cleaning applicators or wipers which are loaded with a cleaning fluid just prior to use without the risk of applying the cleaning fluid from separate containers stored on site.

In particular, it is desired to provide such wipers and methods of using the wipers for cleaning clean rooms and pharmaceutical manufacturing facilities, etc., in which the cleaning fluids are applied to the wipers at a time just prior to their use so as to prevent prolonged contact between the wipers and the fluids.

In accordance with the present invention, the foregoing objectives are met by the provision of a cleaning kit comprising a liquid-tight outer container containing at least one, and, preferably, a plurality of cleaning applicators or wipers and a cleaning liquid in an inner container. Preferably, both the inner and outer containers are plastic bags, and the kit includes a substantial number of wipers. Means are provided for opening the inner bag while it is inside of the outer bag to release its contents for absorption by the wipers. Preferably, the inner bag contains a puncturing device operable by hand pressure from outside.

In the cleaning method using the kit, the kit is stored with the cleaning liquid sealed in the inner container until just prior to use. To apply cleaning liquid to the wipers, pressure is applied, preferably by hand, to the inner container through the material of the outer container to puncture the inner container and release cleaning liquid onto the wipers. The wipers then are allowed to absorb the liquid, the package is opened, and one or more wipers are removed and used to clean surfaces.

It is preferable that the outer bag be re-closable so as to protect wipers remaining in the bag from contamination and to minimize evaporation of the cleaning liquid.

This kit and method make it possible to greatly reduce the amount of time that the cleaning fluid and wiper materials remain in contact with one another, thus reducing the opportunity for additional generation of contaminants, or degeneration of the cleaning fluid.

In accordance with another aspect of the invention, a unique cleaning liquid container is provided. The liquid container preferably is a flexible plastic bag made of material resistant to attack by the cleaning liquid contained in the bag. The bag contains a puncturing device which punctures the wall of the bag when pressure is applied by hand. This allows the discharge of cleaning liquid from the bag to be directed to the most effective location for quick absorption by the wipers.

Preferably, the puncturing device comprises a flat plastic plate with a plurality of projections or spikes extending from one side of the plate. The plate is made of a plastic material such as polyethylene which is impervious to most cleaning liquids, and the projections or spikes are distributed over a substantial area so as to maximize the rate of absorption of the liquid into a stack of wipers.

Preferably, the puncture device is made substantially smaller than the stack of wipers and is located inwardly from the outer edges of the wiper stack to prevent the pressure applied at the edges of the package during the ordinary gripping of it from accidentally puncturing the liquid container. The outer bag is vacuum-sealed to hold the inner bag securely at a central location on the wiper stack. The vacuum sealing also pressurizes the inner bag and discharges the liquid from it relatively quickly.

The likelihood of accidental puncture of the liquid container also is reduced by the fact that pressure applied over a broad area of the container is not effective to cause puncturing. Pressure applied over a relatively small area, by means of a knuckle or other blunt instrument, will cause the desired puncture. In addition, the puncture device is buoyant in the cleaning liquid and its spikes normally do not engage the bottom of the container.

The foregoing and other objects and advantages of the invention will be set forth in or apparent from the following description and drawings.

CLEANING KIT

Figure 1:
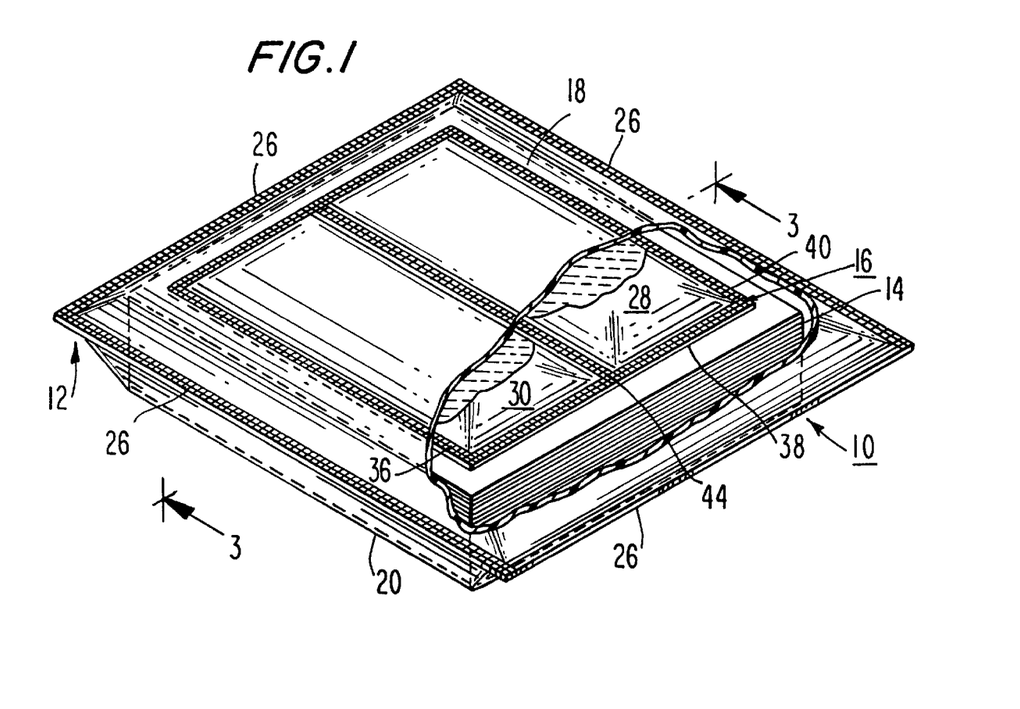
FIG. 1 is a perspective, partially broken-away view of a cleaning kit constructed in accordance with the present invention.

FIG. 1 shows a cleaning kit 10 constructed in accordance with the present invention.

The kit 10 includes an outer container 12, which is partially broken away, a stack 14 of rectangular applicators or wipers, and a frangible container 16 of cleaning liquid resting on top of the wipers.

The outer container 12 is a flexible plastic bag made of a material resistant to attack by the cleaning liquid contained in the container 16. It is air-tight and liquid-tight. It is formed by a first sheet 18 forming a bottom panel on one side, and a second sheet 20 forming a top panel on the opposite side. The sheets 18 and 20 are made of plastic and are adhered together along a seam 26 to form an air-tight and liquid-tight container.

Figure 2:
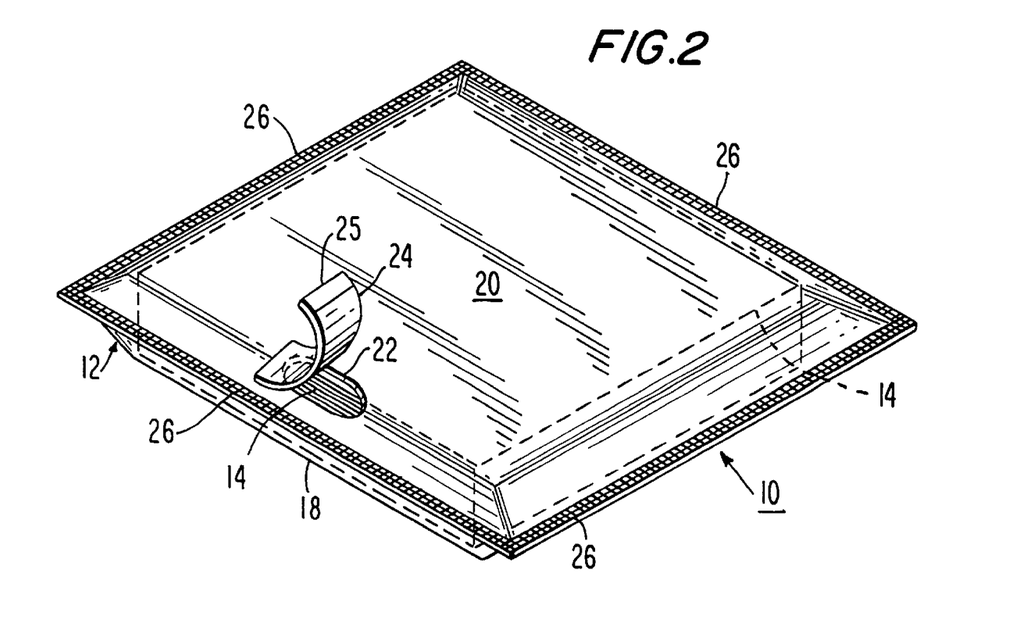
FIG. 2 is a perspective view of the cleaning kit shown in FIG. 1, with the kit inverted.

As it is shown in FIG. 2, in which the kit of FIG. 1 has been inverted, the top panel 20 of the outer container 12 has an elongated outlet opening 22 near one edge. The outlet opening 22 normally is closed by a plastic strip 24 coated with a pressure-sensitive adhesive, except at one end 25 where a tab is left uncoated and free to be grasped by the user. To open the outlet opening, the user pulls on the tab 25, peels back the strip 24, withdraws one or more of the wipers 14 through the opening 22, and re-closes the opening by pressing down on the flap 24, thereby protecting the remaining wipers from contamination.

Preferably, the bag 12 has most of the air evacuated from it so that the material of the bag makes close contact with the stack of wipers 14 and the container 16. This is believed to facilitate the bursting of the frangible container, and to hold it in the preferred position relative to the wipers 14.

FRANGIBLE CONTAINER

Figure 3:
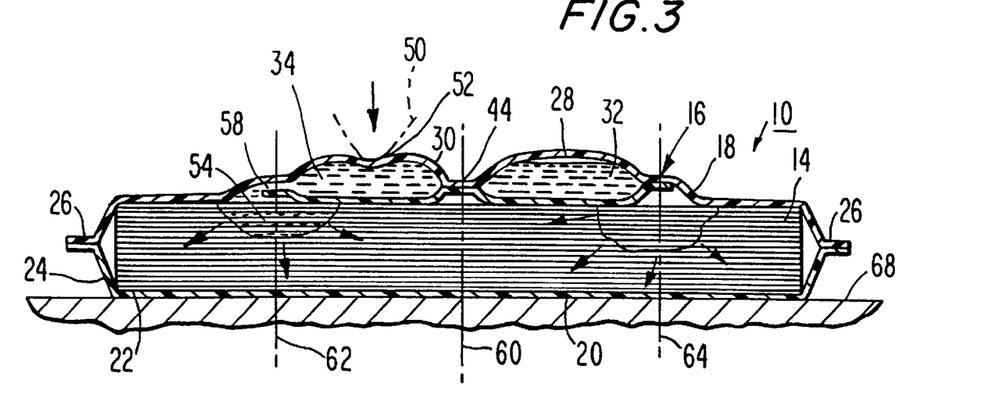
FIG. 3 is a cross-sectional, partially schematic view taken along line 3—3 of FIG. 1.
Figure 4:
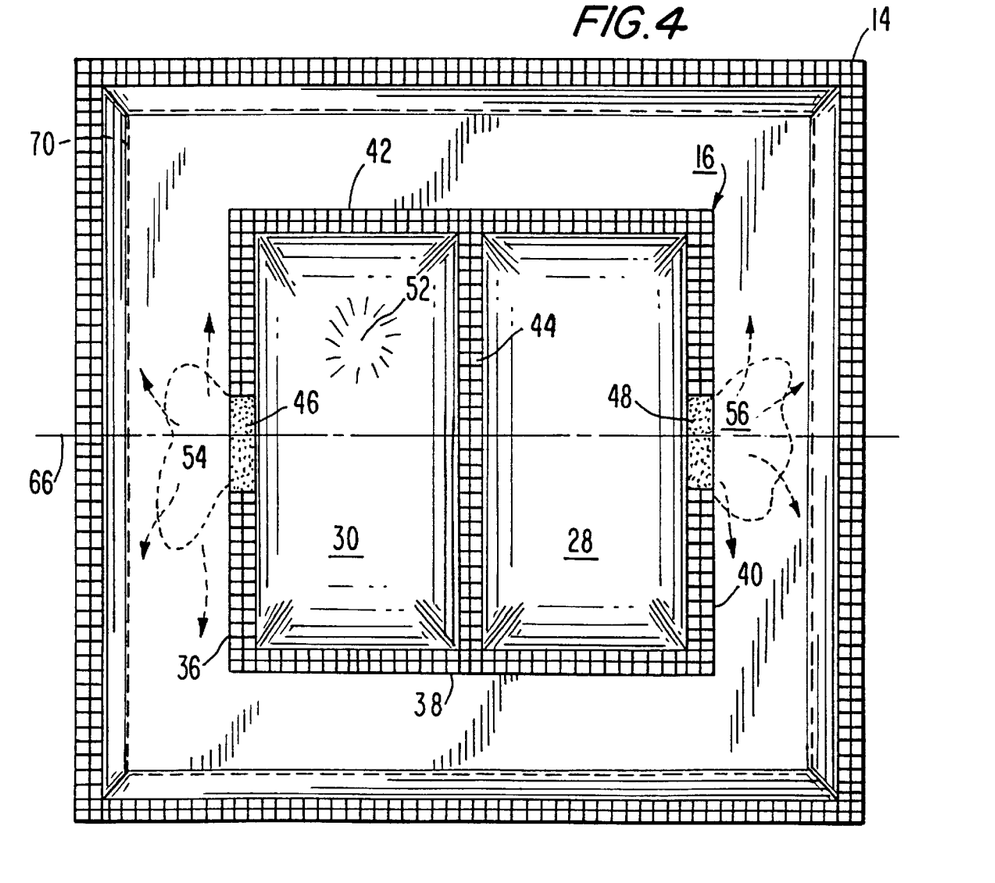
FIG. 4 is a plan view of the contents of the outer container of the kit shown in FIG. 1.

The frangible container 16 is shown in FIGS. 3 and 4, as well as in FIG. 1. Preferably, it comprises two sheets of flexible plastic material sealed together along edges 36, 38, 40 and 42 (FIG. 4), as well as along a center strip 44. This forms two separate compartments 28 and 30, each comprising, in essence, a separate frangible bag.

In accordance with one aspect of the present invention, each of the bags has a weakened area in which it is designed to break when pressure is applied to it. This is used to direct the flow of the cleaning liquid to the wipers in a location which minimizes the time required to dampen the wipers.

Preferably, the seams 36, 38, 40, 42 and 44 are formed using a heat-sensitive adhesive, and the weakened area is provided by weakening the adhesion between the plastic sheets at two zones 46 and 48, one for each compartment. The zones 46 and 48 are located approximately on the lateral centerline 66 of the wiper stack 14, as shown in FIG. 4.

Each weakened zone 46 and 48 is formed by heating the adhesive forming the seams in those zones differently from the remainder of the seams of the bag 16. For example, zones 46 and 48 are heated at a temperature and/or pressure or for a time which is lower than for the remainder of the seams.

Alternatively, the width of the seam or the adhesive coating in each zone 46 and 48 can be reduced relative to the remainder of the seams to provide the desired weakening.

It is desired to set the strength of the weakened areas 46 and 48 at a level sufficient to withstand the application of pressure to the tops of the bags 28 and 30 over a relatively broad surface area, but break apart under pressure applied over a relatively narrow area.

In accordance with one aspect of the present invention, each bag is burst relatively easily by the application of pressure in a relatively small area 52 (see FIGS. 3 and 4). Sufficient pressure can be applied by hand. This can be done by placing the kit 10 on a flat surface 68, such as a table, with the top panel 20 facing downwardly. The bags 28 and 30 bulge upwardly as shown in FIG. 3. Each contains a quantity 32 or 34 of cleaning liquid.

By simply pressing downwardly with the knuckle 50 of one finger in the area 52, sufficient pressure can be developed to burst the seam in zone 46 or 48, creating a gap 58 (FIG. 3) in the seam which allows the discharge of fluid from the container 30 to a location 54.

FIG. 3 shows the area 52 depressed by the knuckle 50 as if it were on the lateral centerline 66 of the kit. Actually, as it is shown in FIG. 4, the area 52 is located near one end of the bag 30. This illustrates the feature of the invention in which it does not matter where on the bag 28 or 30 the pressure is applied; the bag will burst at the proper location anyway.

In order to illustrate the resistance of each bag 28 and 30 to unwanted breakage, it has been found that many people cannot break the bag by applying pressure with the palm of the hand, but can break it easily when pressure is applied by means of one knuckle, or some other blunt instrument which concentrates the force in a small area without puncturing the bag.

From the location 54, the liquid escaping from the bag 30 is absorbed and spreads from the zone 54 downwardly and to the sides, as indicated by the arrows in FIGS. 3 and 4, until the liquid has moistened the entire stack of wipers.

Similarly, applying pressure over a relatively small area of the surface of the container 28 will cause the container to burst at the seam area 48 and will cause the liquid 32 to be discharged into the area 56, from which it spreads downwardly and sideways to help load the cleaning liquid into the wipers.

Preferably, the areas 54 and 56 of fluid discharge are located on the lateral centerline 66 of the wiper stack, as shown in FIG. 4, and near a line 62 or 64 which is approximately mid-way between the vertical centerline 60 of the wiper stack (FIG. 3), and the right and left edges of the stack. This insures relatively rapid distribution of the liquid into the wipers.

It should be understood that liquid might emerge from the openings in the bags 28 and 30 in a jet and thus might run down the sides of the outer bag 12. This would alter the flow pattern of the liquid as it is absorbed, but may speed the absorption process.

After the bags 28 and 30 have been burst, the user simply allows the kit 10 to rest in the position shown in FIG. 3 for a certain period of time until the liquid has been distributed throughout the stack of wipers.

Then, the user inverts the package to the position shown in FIG. 2, pulls back the strip 24 to expose the edges of the wiper stack through the outlet hole 22, removes one or more wipers for use, and replaces the adhesive flap over the opening 22 to protect the remaining wipers.

Advantageously, because the outer bag 12 has been inverted from the position shown in FIG. 1, the empty cleaning liquid bags 28 and 30 now are on the bottom of the wiper stack 14 where they do not interfere with the removal of the wipers from the package.

This arrangement has further advantages when it is time to dispose of the packaging. Since the empty bags 28 and 30 are still in the outer container 12, it is a simple matter to throw away all of the packages simultaneously, without any handling of the bags 28 and 30.

As it has been stated above, by evacuating most of the air from the outer bag 12, the bags 28 and 30 are held in a desired position relative to the stack of wipers 14. Alternatively, an adhesive can be applied to the outer surfaces of the bags 28 and 30 which makes contact with the inside of the wall 18 of the outer bag so as to hold the bags 28 and 30 against shifting and insure their proper location when broken.

ALTERNATIVE EMBODIMENTS

The rate of absorption of cleaning liquid can be increased even further by increasing the number of frangible bags used, thus further reducing the distance required for the liquid to travel in dampening all of the wipers.

For example, four bags, each with its own weakened area, can be used in place of the two bags 28 and 30. The fluid release points then could be located at a spacing between the top and bottom borders of the stack 14, shown in FIG. 4, like that used between the side borders, as shown in FIG. 3. That is, two release points could be midway between the lateral centerline 66 and the upper edge, and two midway between the centerline 66 and the bottom edge of the stack.

Figure 5:
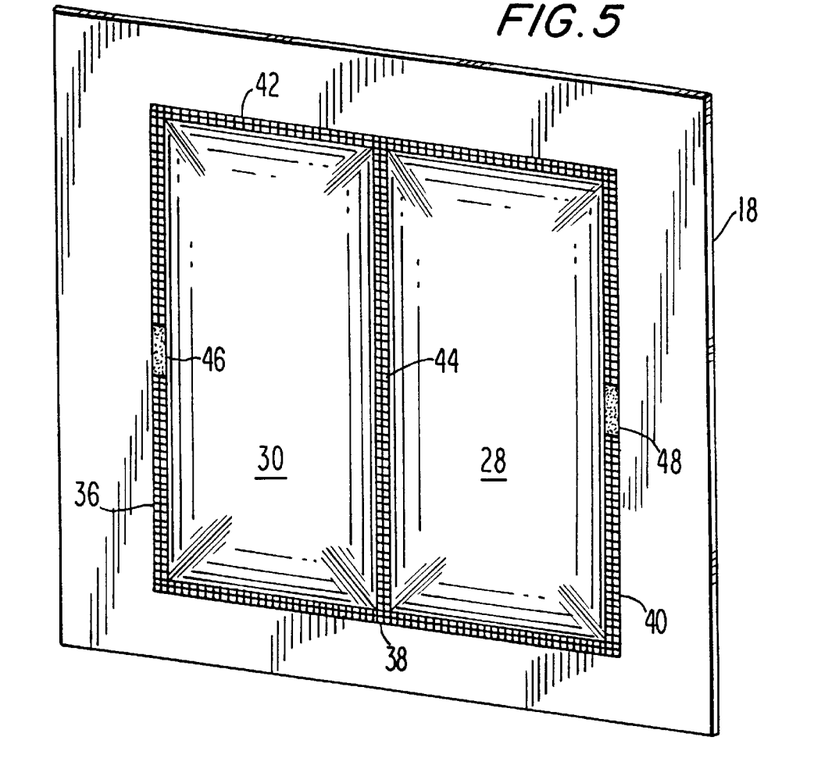
FIG. 5 is a perspective view of a portion of an alternative embodiment of the invention.

FIG. 5 shows an alternative construction for the bags 28 and 30. Instead of using two separate sheets of plastic, only one is used, together with the sheet 18 forming the bottom wall of the outer bag 12. This saves plastic material, and ensures that the bags will be secured in place relative to the wipers so as to assure proper distribution of the liquid into the wipers.

In addition, the outlines of the bags will be more visible to the user because the adhesive forming the seams 36, 38, 40, 42, and 44 will create faint outlines on the outer surface of the bottom 18 of the outer bag.

Preferably, the bags 28 and 30 are formed as pockets, with one open edge for filling, before the sheet 1 is attached to the sheet 20 to form the bag 12. The pockets are filled and sealed shut, and the sheet 18 is attached to the sheet 20 to complete the bag 12.

In order to make the frangible bags more visible to the user, the bottom wall 18 of the outer bag 12 can be made transparent.

Figure 6:
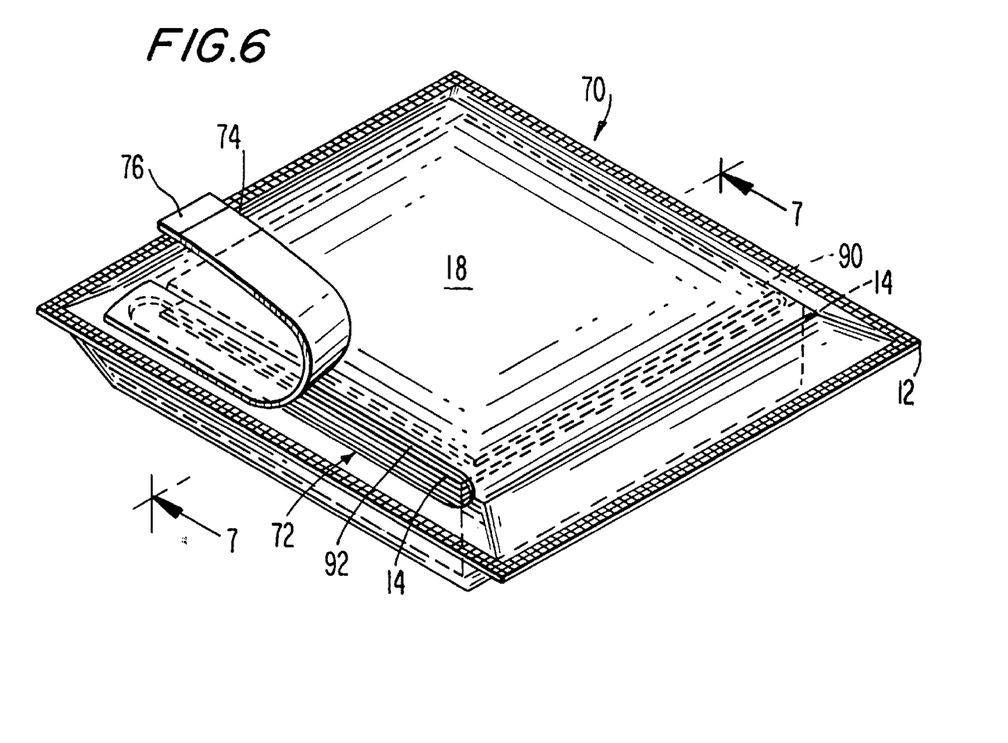
FIG. 6 is a perspective view of another embodiment of the invention.
Figure 7:
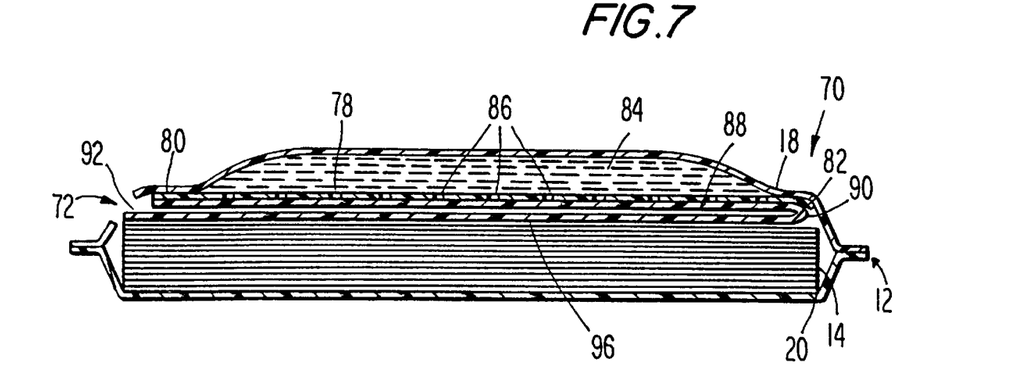
FIG. 7 is a cross-sectional view taken along line 7—7 of FIG. 6.
Figure 8:
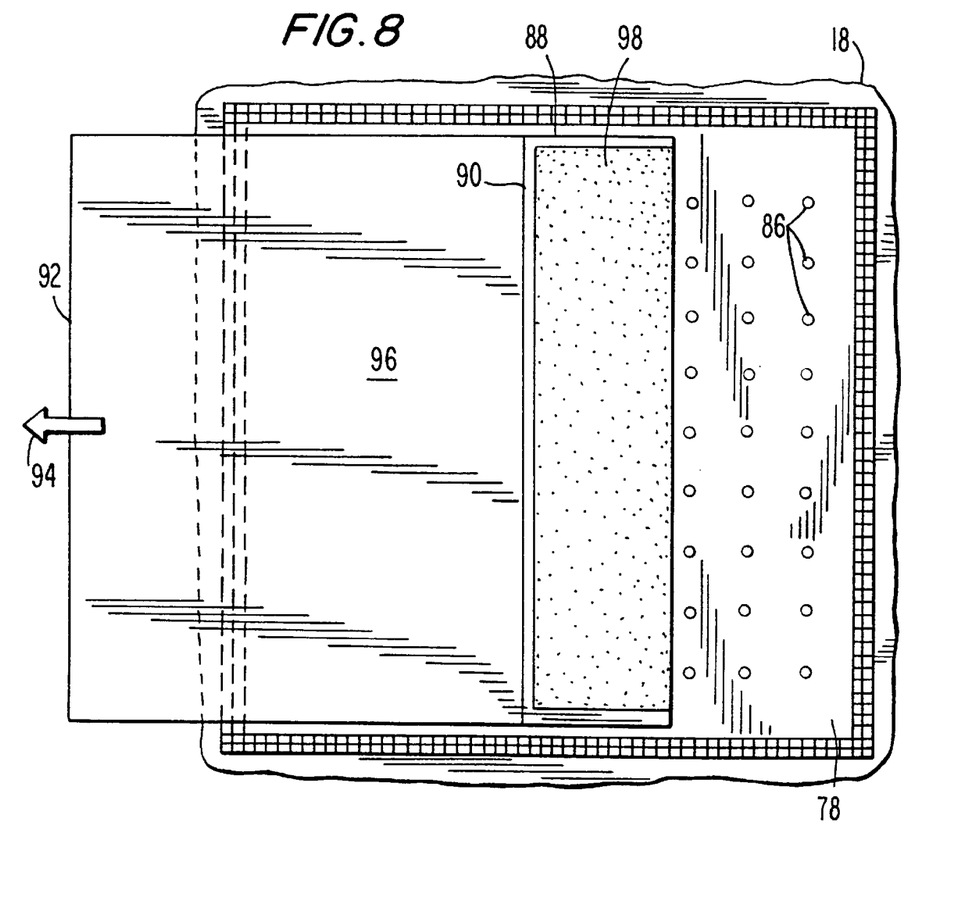
FIG. 8 is a bottom plan view of a portion of the device shown in FIGS. 6 and 7.

FIGS. 6 through 8 show another alternative embodiment of the invention.

Shown in FIGS. 6 and 7 is a kit 70, similar to that shown in the previous Figures of the drawings. However, the kit has a different means for releasing the cleaning liquid from the internal bag or bags to load the cleaning liquid into a stack 14 of wipers.

In the embodiment shown in FIGS. 6 and 7, an elongated re-closable outlet opening 72 is provided along one edge of the side panel 18 of the outer container 12. This is provided instead of the opening in the other surface 20 of the bag shown in FIG. 2.

The inner cleaning solution-containing bag is formed by a perforated plastic panel 78 which is secured at seams 80 and 82 at its edges to the panel 18 of the outer bag, in the manner shown in FIG. 5. The panel 78 has a plurality of relatively small holes 86 spaced over a large portion of its surface.

An adhesive sealing strip 88 covers the holes 86 and prevents liquid 84 from leaking out of the inner container until it is desired to release the liquid.

The strip 88 is coated with adhesive only in a certain area 98 (FIG. 8). Areas 90, 96 and 92 are not coated with adhesive. The uncoated strip portion is folded at 90, and the end of the strip 92 extends slightly outwardly from the stack of wipers, as shown in FIG. 7. By this means, the end 92 can be gripped by a user to pull the adhesive strip in the direction indicated by the arrow 94 in FIG. 8 to peel it away from the bottom of the liquid container and release the liquid through the holes 86 to be absorbed by the wipers 14.

Due to the numerous holes 86, the liquid 84 is distributed and dispensed relatively quickly into the wiper stack.

Therefore, absorption of the liquid by the wipers is relatively rapid. After the relatively short period of time required for the cleaning liquid to soak into the wipers, the wipers can be removed through the opening 72 for use. Thereafter, the opening 72 can be re-closed by pressing the adhesive strip 74 down, in the same manner as the strip 24 shown in FIG. 2.

The liquid-containing bag is not in the way of the removal of wipers after its use because it is integral with the upper panel 18 of the outer container 12 and is no more of an impediment to removal of the wipers than the panel 18 itself would be.

It should be understood that, as it is shown in FIG. 7, the surfaces 96, 78, and the upper surface of the wiper stack 14 are shown separated, for the sake of clarity in the drawings. Actually, they would be pressed together and the kit 70 would be somewhat thinner than shown in FIG. 7.

If it is desired to separate the single inner container into multiple containers, in a manner similar to the embodiments shown in FIGS. 1 through 5, the separate containers can be aligned with their longitudinal axes parallel to the direction of the arrow 94. Then, a separate adhesive strip can be provided for each separate pouch. These narrower adhesive strips may be somewhat easier to remove than the single wide strip.

In another embodiment, a tear strip (not shown) can be used to tear open the bottom of a pouch similar to that shown in FIGS. 6–8. The tear strip has an end available for gripping, like the end 92 shown in FIGS. 6–8.

PREFERRED EMBODIMENT

FIGS. 9 through 12 show the preferred embodiment of the invention.

Figure 9:
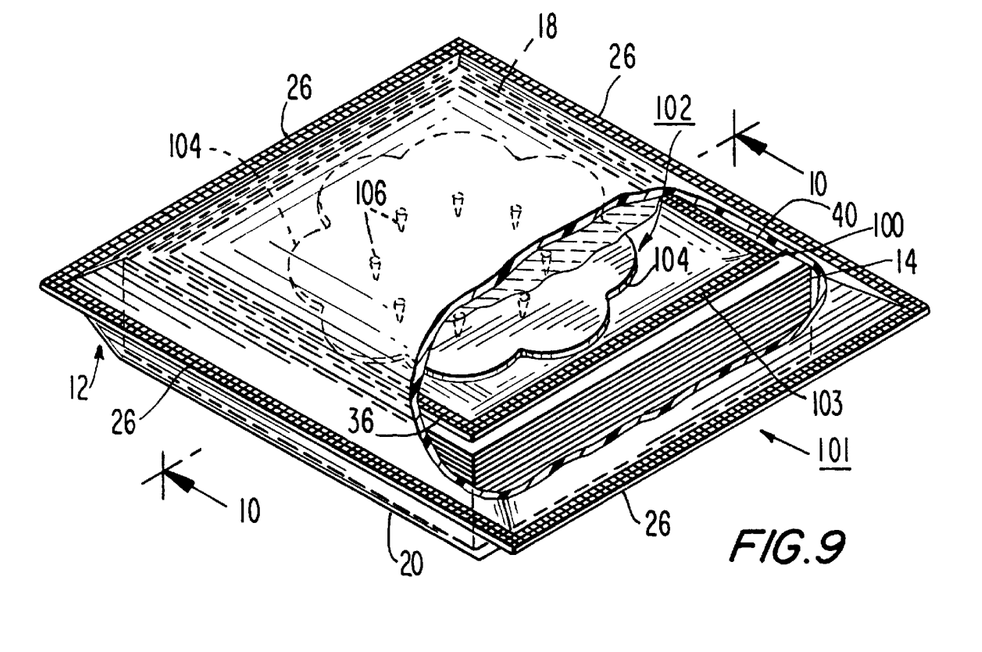
FIG. 9 is a perspective view partially broken-away, of another embodiment of the cleaning kit of the invention.
Figure 10:
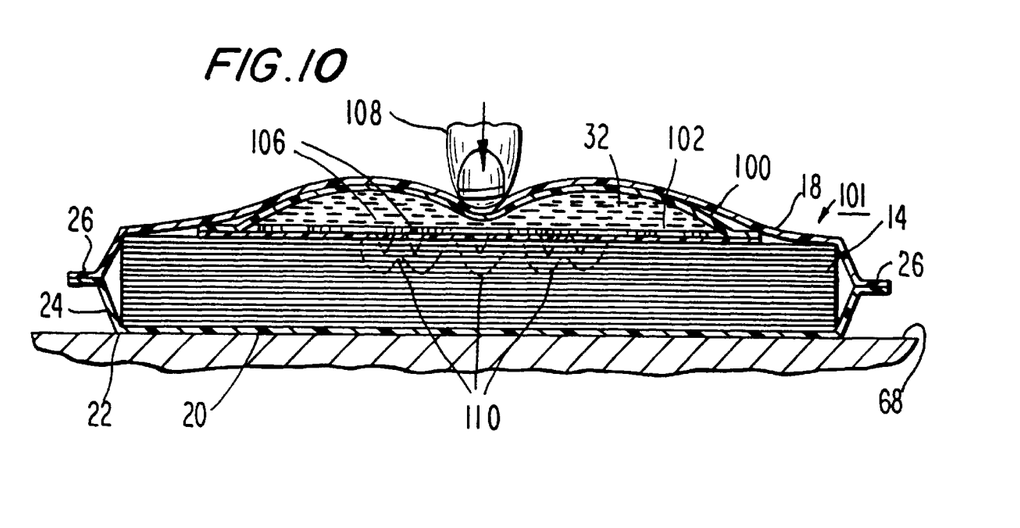
FIG. 10 is a cross-sectional view taken along line 10—10 of FIG. 1.

The cleaning kit 101 shown in FIGS. 9 and 10 is the same as the cleaning kit 10 shown in FIG. 1, except the internal bag or container 100 is not frangible. Instead, the bag 100 is an ordinary plastic bag with a conventional heat seal 103 all the way around. The bag 100 contains a puncturing device 102, in addition to cleaning fluid 32 (see FIG. 10).

Figure 11:
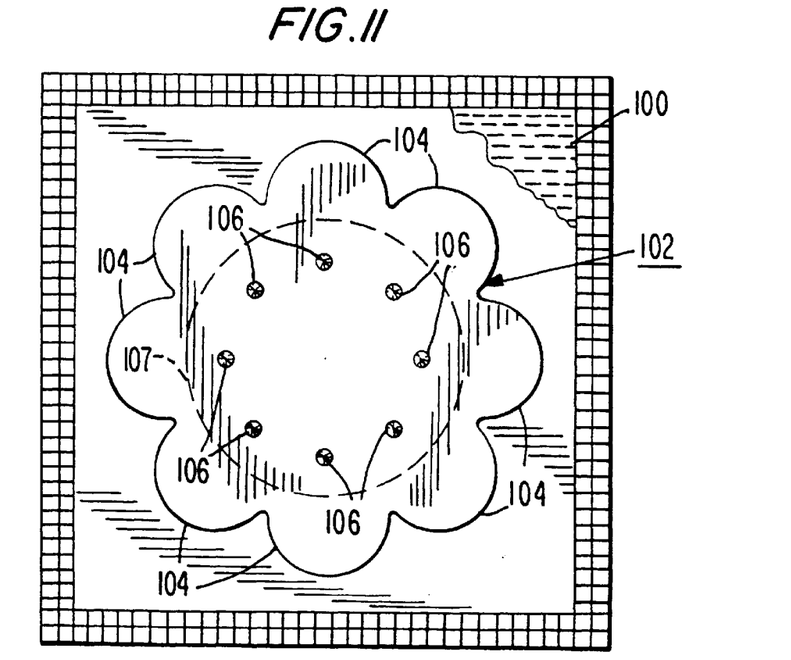
FIG. 11 is a top plan view of a portion of the kit shown in FIGS. 9 and 10.
Figure 12:
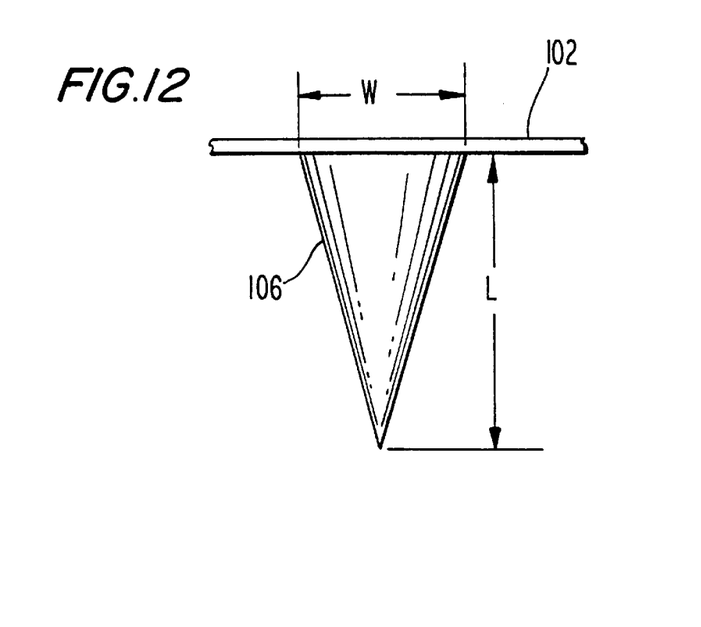
FIG. 12 is an enlarged elevation view of one of the spikes of the perforation plate shown in FIGS. 9–12.

As it is shown in FIGS. 9 through 11, the puncturing device 102 comprises a plastic plate having a plurality of projections or spikes 106 extending from one side of the plate. FIG. 12 provides an enlarged view of one of the spikes 106. Each spike 106 has a conical shape and is pointed at its end. The spikes 106 are arranged in a circle spaced outwardly from the center of the plate. The edges of the plate are scalloped as shown at 104.

The puncturing device 102 preferably is molded out of a cleaning liquid-resistant plastic material such as polyethylene.

The kit 101 is used in the following manner. The outer container 18 with a stack of wipers 14 in it is laid on a flat surface 68 (FIG. 10). The puncturing device 102 is actuated by the user applying pressure in a limited area such as by pressing a finger 108 or a thumb downwardly on the outer package at about the center of the package. This applies downward pressure on the puncturing plate 102, and the spikes 106 pierce the bottom wall of the bag 100 and allow the liquid 32 to flow into the wipers in the areas 100 (FIG. 10) and be absorbed into the wipers.

The kit 101 is protected against accidental puncture by making the bag 100 substantially smaller than the wipers 14, and by positioning the spikes 106 inwardly from the outer edges of the plate. By this means, a substantial distance is created between the edge of the outer container 18 and the edge of the puncturing plate. Thus, when a person grasps the package at the edge, the thumb will not accidentally depress the plate and cause an unwanted puncture.

It is preferred that the outer bag 18 be vacuum sealed. This holds the inner bag 100 in a central location on the stack of wipers 14.

Unwanted accidental puncture also is prevented by the fact that pressure sufficient to cause a puncture is not transmitted within the bag by the application of pressure over a large portion of the surface area of the bag 100. However, adequate pressure is provided when it is applied by means of a knuckle, finger, thumb, or blunt instrument. Thus, when the kits are stacked on top of one another during shipment, accidental punctures are not likely to occur.

The puncturing device 102 preferably is buoyant within the liquid 32 contained in the bag 100. Thus, it normally floats above the bottom wall of the bag 100 when the kit 101 is positioned as shown in FIG. 10. This is believed to help to prevent accidental puncture.

The shape of the plate forming the puncture device can be varied without changing the nature of the invention. For example, the disc from which the spikes 106 extend can have a generally circular shape as indicated by dashed line 107 in FIG. 11. A square or other geometric shape is also feasible.

In a cleaning kit which has been built and successfully tested, the bag 100 was a square bag seven and one-half inches on each side; the outer container 18 was a square bag eleven and one-half inches on each side; and the maximum diameter of the puncture plate was five and one-half inches. The thickness of the plate was 0.08 inches.

Referring to FIG. 12, the length L of each of the spikes 106 was approximately 0.35 inch, and the width W of each spike at its base was approximately 0.25 inch. The length of each spike is minimized to lessen the chances of accidental puncture, without detracting substantially from the ability of the spikes to puncture the bag 100.

As it has been stated above, the outer bag 18 preferably is vacuum sealed; that is, it is at least partially evacuated of air. This has several advantages when used with the present invention.

One advantage of vacuum sealing is that the bag 100 is held tightly against the stack in a central location so that it does not shift from one side of the package to the other during shipping and handling. This prevents the puncturing disc from coming too close to any of the edges of the package and, thus, helps to avoid accidental puncture.

Vacuum sealing has another advantage. This is that the cleaning liquid 32 in the bag 100 is pressurized by the vacuum so that the liquid passing through the openings made by the spikes 106 puncturing the bottom wall of the bag 100 flows through the holes much faster than it would otherwise. This makes the absorption of the liquid into the wipers 14 much faster than if the vacuum were not applied.

Also, vacuum sealing holds the wipers tightly against one another so that they will not rub against one another. This prevents the increase of the number of loose particles which might be developed in the wipers by rubbing them against one another.

The bag 100 is advantageously made with ordinary heat-sealing procedures and is relatively low cost to make. The puncturing device also is relatively inexpensive and is bio-degradable, as are other materials in the kit.

Thus, the kit 101 is relatively inexpensive to make and easy to use. It allows the wetting of the wipers to be delayed until just prior to the use of the wipers, thus preventing the deleterious effects of prolonged contact between the cleaning liquid and the wipers.

WIPERS

The term "applicator" or "wiper", as used in this specification, is intended to mean a cleaning fabric, suitable for use in cleaning surfaces in clean rooms and the like.

Such applicators or wipers are distinguished from tissues and similar materials in that they are extremely clean, and in that they have a relatively high degree of wet strength and structural integrity when used to wipe surfaces while dampened or saturated with cleaning liquids.

As it is well known, a certain minimum amount of liquid must be applied to a stack of wipers in order for the liquid to be distributed throughout all of the wipers without dry spots. This minimum amount varies depending upon the type of wiper used, the type of cleaning fluid used, and other factors. However, a typical level might be 20% to 40% of the amount required for full saturation.

Typically, when clean room wipers are used in wet cleaning applications, the degree of saturation is substantially below 100%, usually in the range between 40% and 70%, so that the wiper releases solvent onto the surface when it is pressed against the surface, and re-absorbs the liquid when pressure is released so as to leave no substantial residual liquid on the surface.

In contrast, in pharmaceutical manufacturing facilities, it often is desired to leave a coating of liquid biocide on the surface so as to provide maximum sterilization. Thus, such wipers often are saturated completely with a biocide-containing cleaning substance.

The total quantity of cleaning liquid in the frangible bags 28 and 30 is at least equal to the minimum needed to moisten all the wipers, and can be in excess of 100% of the amount needed for full saturation.

Cleaning fabrics used in sensitive areas, such as semiconductor fabrication clean rooms and pharmaceutical manufacturing facilities, are carefully selected for characteristics such as particle emission levels, levels of ionic material, adsorptiveness, resistance to attack or degradation by cleaning materials used, and lack of attack by or degradation of biocides.

Some of the wiper fabrics which have been successfully used in such applications include knitted, woven and non-woven fabrics such as the following:

1. 100% polyester or nylon, preferably knitted from continuous filament yarn. Typical products are sold under the trademarks "AlphaWipe"; "AlphaSorb"; and "Alpha10"; or "MiracleWipe" by the Texwipe Company, Upper Saddle River, N.J. Woven polyester or nylon fabrics also can be used.

Some of such fabrics are sealed along the edges, in the manner indicated schematically in FIG. 4 at 70, and as more fully described in U.S. Pat. No. 4,888,229.

2. 100% spun bond polypropylene. The fibers of these fabrics are arranged randomly and are bound together by heat or chemical action. A typical product using this construction is sold under the trademark "PolySat" by the Texwipe Company.

3. 55% cellulose and 45% polyester fiber or 100% polyester bound together by hydroentanglement. A typical product is the Texwipe "TechniCloth" product.

4. 100% polyurethane foam.

5. Other fabrics made of rayon, acrylic, abaca, (e.g., "M-Wipe" wipers sold by Texwipe), hemp, cotton, etc.

CLEANING FLUIDS

Cleaning fluids suitable for use in the invention include virtually any substance capable of cleaning. Some of the cleaning substances which can be used in this invention and which sometimes cause problems due to prolonged contact with wiper materials are listed below:

1. Deionized water. Deionized water is a more aggressive solvent than ordinary water. Furthermore, there is a danger of bacterial growth if the water remains in prolonged contact with wiper materials.

A bactericide can be added to the water. However, it sometimes loses is effectiveness due to prolonged contact with the wiper material. It also may introduce contamination into the cleaning liquid.

2. A biocide and water.

3. A mixture of water and alcohol, isopropyl alcohol ("IPA") in particular. Solutions of 6% or less IPA to 100% IPA can be used.

4. A mixture of water and glycol ether, such as propylene glycol ether. The percentage of active ingredient can vary from 3% to 100%, but the normal range is 3% to 6%. A typical product is sold under the trademark "TexPure" by Texwipe.

5. Acetone—100% pure. Acetone is very volatile and can attack some adhesives.

6. A mixture of water and detergent and/or surfactant with or without a biocide.

7. For cleaning optical surfaces, a glass cleaner containing ammonia or other basic solution, such as sodium hydroxide.

8. Hydrogen peroxide plus water. A 35% solution usually is used, together with a stabilizer.

9. Various organic solvents.

10. Terpenes. Terpenes tend to dissolve the adhesive seal on the outside container when it is subjected to prolonged contact, thus limiting the choices of adhesive when manufacturing the product.

11. Acids (weak solutions).

12. A solution of a bleach such as sodium hypochlorite and water.

BAG MATERIALS

The material of which both the frangible bag 16 and the outer bag 12 are made should be resistant to attack to the cleaning fluid in the kit. For example, polypropylene is resistant to a wide variety of cleaning solvents, and thus is a preferred material. Polyethylene similarly is a suitable material.

Also, Teflon (polytetrafluoroethylene) can be used where its greater expense is justified.

NUMBER OF WIPERS IN A KIT

The thickness of the stack 14 of wipers in a particular kit can vary from one up to a very substantial number. However, the larger the number of wipers in a kit, the longer it will take for the wipers to absorb the cleaning fluid. Therefore, the number to be used in a particular kit depends upon the cleaning fluid, the wipers and the length of time the user is willing to wait after releasing the liquid before the wipers can be used.

Typically, with most of the wipers specifically identified above, a kit containing 50 wipers would be considered to be most widely acceptable. In clean room use, such a quantity typically will last from one day to two weeks. However, up to several hundred wipers could be placed in a single kit, if desired.

With around 50 wipers and typical cleaning fluids, the waiting time for full absorption of the cleaning fluid is of the order of magnitude of 5 minutes. Times up to 20 minutes might be required in certain circumstances.

Of course, if a smaller number of wipers is used, the absorption can be very fast.

For example, a kit containing a relatively small number of, say, 1 to 5 wipers could be used as an emergency kit. The kit could be activated very quickly because the small number of wipers would not require a long time to become moistened.

The speed of readying the wipers for use can be increased even further by increasing the quantity of liquid distributed to the wipers. Although the wipers might be somewhat overloaded with cleaning fluid, that could be acceptable on a temporary basis, in exchange for faster readiness for use in emergencies.

It should be understood that various other means of releasing the liquid from the internal container can be devised without departing from the basic concept of the present invention.

The above description of the invention is intended to be illustrative and not limiting. Various changes or modifications in the embodiments described may occur to those skilled in the art. These can be made without departing from the spirit or scope of the invention.

We claim:

1. A cleaning method comprising the steps of:
   (a) providing a cleaning kit comprising at least one absorbent cleaning applicator and a first liquid-tight container containing a cleaning liquid, both contained within a second container, one of said cleaning liquid and said applicator being subject to deterioration due to prolonged contact with the other, the quantity of said cleaning liquid being from at least enough to moisten said applicator to more than 100% of the quantity needed to saturate said applicator;
   (b) releasing said cleaning liquid from said first container into said applicator by puncturing said first container at a time proximate the time when said applicator is to be used for cleaning;
   (c) removing said applicator from said second container; and
   (d) utilizing said applicator for cleaning.

2. A method as in claim 1 in which said applicator is a clean room wiper, and in which said step of utilizing said applicator for cleaning comprises wiping a surface in a clean room with said wiper containing said cleaning liquid.

3. A method as in claim 2 in which said cleaning liquid includes a solvent and said applicator is made of a material subject to the production of increased numbers of contaminants due to prolonged contact with said solvent.

4. A method as in claim 1 in which said second container contains a plurality of said absorbent cleaning applicator the quantity of said cleaning liquid in said kit is from a quantity sufficient to moisten said applicator to a quantity in excess of 100% of the amount needed to saturate said applicator, and said second container is liquid-tight and has an opening with a replaceable closure member, and including the step of removing said closure member to remove one of said applicators, and replacing said closure member after said applicator has been removed.

5. A method as in claim 1 in which said first container has a puncturing member within it, and said step of releasing said cleaning liquid comprises pressing on said first container through said second container to burst said first container.

6. A method as in claim 1 in which said second container has a resealable outlet opening and contains a plurality of said absorbent cleaning applicator in a stack the quantity of said cleaning liquid in said kit is from a quantity sufficient to moisten each of said applicators to a quantity in excess of 100% of the amount needed to saturate said applicators, said first container containing a puncturing device operable from without said second container, said first container being located on one side of said stack, said outlet opening being located on a different side of said stack, in which said step of releasing said cleaning liquid comprises placing said kit on a surface with said first container on top of said stack, pressing on said second container to cause said puncturing device to puncture said first container, allowing said second container to sit for a length of time with said first container on top of said stack, until said cleaning liquid has been distributed and substantially absorbed by said applicators, turning said second container over to locate said first container at the bottom of said stack, unsealing said outlet opening and removing at least one of said applicators, and resealing said opening.

7. A method as in claim 1 in which said applicator is made of a fabric selected from a group consisting of knitted fabrics and woven fabrics; non-woven fabrics, including spunbond fabrics and hydroentangled fabrics; and foam.

8. A method as in claim 7 in which said fabrics are made of a material selected from a group consisting of polyester; polypropylene; nylon; a mixture of cellulose and polyester; polyurethane; acrylic; rayon; abaca; hemp; and cotton.

9. A method as in claim 1 in which said kit has a plurality of said applicator and the quantity of said cleaning liquid in said kit is from a quantity sufficient to moisten each of said applicators to a quantity in excess of 100% of the amount needed to saturate said applicators.

10. A method as in claim 9 including a plurality of applicators which are made of fabrics selected from a group consisting of knitted or woven continuous filament polyester or nylon fibers; spun-bond polypropylene fibers; a hydroentangled mixture of a major portion of cellulose and a minor portion of polyester fibers; polyurethane foam; woven or knitted rayon; acrylic; abaca; hemp; and cotton fibers.

11. A method as in claim 11 in which said cleaning liquid contains a biocide and said applicator is made of foam.

12. A method of using cleaning wipers for cleaning surfaces in clean rooms while releasing a minimum of contaminants, said method comprising the steps of
   storing a plurality of clean room wipers in a first container;
   providing a clean room cleaning liquid in a second container having a puncturing device and contained within said first container, one of said cleaning liquid and said wipers being subject to deterioration due to contact with the other, the quantity of said cleaning liquid being from at least enough to moisten said wipers to more than 100% of the quantity needed to saturate said wipers;
   actuating said puncturing device to release said cleaning liquid from said second container into said first container at a time just prior to using any of said wipers in cleaning;
   opening said first container and removing a wiper therefrom; and
   using said wiper in cleaning.

13. A method as in claim 12 including the step of storing said first and second containers for a substantial period of time after they are assembled together but before use of the wipers.

* * * * *